United States Patent
Taylor

(10) Patent No.: US 6,803,583 B2
(45) Date of Patent: Oct. 12, 2004

(54) SCINTILLATOR FOR ELECTRON MICROSCOPE AND METHOD OF MAKING

(75) Inventor: Myron Eugene Taylor, Brookeville, MD (US)

(73) Assignee: M.E. Taylor Engineering Inc., Brookeville, MD (US)

(*) Notice: Subject to any disclaimer, the term of this patent is extended or adjusted under 35 U.S.C. 154(b) by 399 days.

(21) Appl. No.: 09/812,880

(22) Filed: Mar. 21, 2001

(65) Prior Publication Data

US 2002/0134937 A1 Sep. 26, 2002

(51) Int. Cl.[7] .............................. H01J 3/26; G01T 1/00
(52) U.S. Cl. ................ 250/397; 250/488.1; 250/486.1; 250/487.1
(58) Field of Search ............................ 250/397, 488.1, 250/486.1, 487.1

(56) References Cited

U.S. PATENT DOCUMENTS

| | | | | |
|---|---|---|---|---|
| 3,887,827 A | * | 6/1975 | Katayama | 313/390 |
| 3,919,582 A | * | 11/1975 | Ochs | 313/383 |
| 4,891,522 A | * | 1/1990 | Coon et al. | 250/370.1 |
| 4,940,919 A | * | 7/1990 | Enck et al. | 313/526 |
| 5,212,385 A | | 5/1993 | Jones | 250/310 |
| 5,317,275 A | | 5/1994 | Mount et al. | 250/310 |
| 5,347,791 A | | 9/1994 | Ginzl et al. | 250/397 |
| 5,412,211 A | | 5/1995 | Knowles | 250/310 |
| 5,517,033 A | | 5/1996 | Krivanek et al. | 250/347 |
| 5,530,441 A | | 6/1996 | Takatou et al. | |
| 5,635,720 A | * | 6/1997 | Mooney et al. | 250/397 |
| 5,866,907 A | * | 2/1999 | Drukier et al. | 250/366 |
| 5,932,880 A | * | 8/1999 | Koguchi et al. | 250/397 |
| 5,941,339 A | | 8/1999 | Shimizu et al. | 259/302 |
| 5,990,483 A | * | 11/1999 | Shariv et al. | 250/397 |
| 6,051,834 A | * | 4/2000 | Kakibayashi et al. | 250/311 |
| 6,265,812 B1 | * | 7/2001 | Watanabe et al. | 313/103 CM |
| 6,414,309 B2 | * | 7/2002 | Mooney et al. | 250/311 |
| 6,573,506 B2 | * | 6/2003 | Sato et al. | 250/361 R |
| 6,608,312 B1 | * | 8/2003 | Okada et al. | 250/370.11 |

OTHER PUBLICATIONS

M.E., Taylor, "An Improved Light Pipe for the Scanning Electron Microscope" Rev. of Scien. Instruments, vol.43, No. 12, Dec. 1972 by M.E. Taylor.

"Scintillators for the SEM—A Practical Guide" by M.E. Taylor Microscopy Today, Jul. 1992.

"Scanning Electron Microscopy—A Student's Handbook" by Postek et al, pp. 26–28 and 45.

* cited by examiner

Primary Examiner—John R. Lee
Assistant Examiner—Kalimah Fernandez
(74) Attorney, Agent, or Firm—Randall G. Erdley

(57) ABSTRACT

A scintillator for an electron microscope includes a substrate (24) of optically transparent material in disc shaped form, a retaining ring (20) of highly conductive material having a non-oxidizing surface around the substrate and having a radially inwardly extending lip (22) on one end, a coating of indium tin oxide (26) on surface (28) of the substrate, electrically conductive adhesive material (32) between the lip and the radially outer part of the coating, and scintillator material (36) bonded to surface (38) of the coating. The indium tin oxide coating may be applied by sputtering and the scintillator material may br deposited onto the coating by settlement deposition. All contacting surfaces are intimately bonded to provide maximum conductivity resulting in better signal to noise ratio. The conductive substrate minimizes pinhole interference, the scintillator is easier to handle during installation and no aluminum overcoating is required.

8 Claims, 2 Drawing Sheets

SCINTILLATOR FOR ELECTRON MICROSCOPE AND METHOD OF MAKING

BACKGROUND OF THE INVENTION

This invention relates to electron microscopes and more particularly to scintillators for electron microscopes and a method of making scintillators. General principles of electron microscopy, and particularly scanning electron microscopy (SEM), is explained in "Scanning Electron Microscopy", by Postek, Howard, Johnson and McMichael, particularly pages 26, 27 and 28 (incorporated herein by reference). A beam of electrons is focussed onto a specimen producing a scattering of two types referred to as secondary and backscatterd electrons emitted outward from the specimen surface in all directions. These may be detected by a further known system as shown schematically in FIG. 1 wherein the microscope column includes a collector 1, scintillator 2, light pipe (or guide) 3 and detector base 4 together with other components forming the detector assembly. Scintillator 2 is mounted on the end of light pipe 3 covered by collector 1 supported by small screws on detector base 4 so that the scintillator is within the specimen chamber 5 when detector base 4 is mounted on a wall thereof 6 such as shown schematically in FIG. 2. This figure shows parts of the microscope that are positioned outside the specimen chamber, such as photomultiplier 7 (PMT) in case 8 mounted such as by PMT cover mount 9 on the side of detector base 4 opposite to that on which the detector assembly is mounted. A rubber light shield 10 may also be used as shown and a preamplifier case 11 is mounted at the outer end of the PMT. A collector voltage cable 12 extends through the detector base and is connected at its end 13 to collector 1. A scintillator high tension cable 14 is similarly connected at its end 15 to a ring 15 around the scintillator so that when the cables are energized the collector is positively biased to draw electrons to the scintillator. The scintillator is a thin plastic disc coated with a special phosphor and also coated with aluminum which serves as a mirror to direct the photons toward the PMT 7. The positive bias accelerates low energy secondary electrons toward the detector, but does not influence higher energy backscattered electrons. Electrons strike the scintillator and the phosphors thereon produce photons (small flashes of light), several photons being emitted, theoretically, for each incoming electron. The photons are transported through light pipe 3 from the evacuated microscope column. Light pipes are generally made of plexiglass or polished quartz for example. Photons carried by the light pipe are converted by the PMT and a photocathode (not shown) to an amplified electronic signal outside the microscope column which can then be displayed on a cathode ray tube with the brightness on the screen being proportional to the number of secondary electrons emitted from the specimen. The amplification of the signal with the PMT is far less efficient than that of the scintillator, in that noise is greatly amplified with the PMT.

Scintillators for the SEM of the type of this invention are discussed in my article "Scintillators For The Sem", by M. E. Taylor, published in "Microscopy Today", July, 1998 (incorporated herein by reference), which states, inter alia, that without a properly functioning scintillator images tend to be noisy, weak, or exhibit other signs of degradation. This article also states that there are three types of scintillators generally used in the SEM: organic/polymeric, phosphor powder, and crystalline (single or poly). Also, plastic scintillators are currently used less frequently mainly because they are subject to radiation damage which causes a short lifetime, although this type of scintillator has the shortest decay time (about 2.2–5 ns) and very low noise. Using a quartz substrate the scintillator material, in liquid form, is spin coated to produce a uniform thin film, which makes a more robust product and introduces a minimum of organic material to the high vacuum system. The films may be over coated with aluminum for conductivity. Various phosphor powders have been used, but the P47 line of materials appears to be most preferred. They are generally produced by settling in proprietary sollutions, with or without binders, on glass/quartz. Grain size of the phosphor, thickness of the layer, and other additives to the settlement tank can vary the results. The phosphors have a somewhat longer decay time (about 20–40 ns), but these are still within the bounds to be used at fast scan rates. They last 2–3 times longer than plastic scintillators, as long as the vacuum is clean. A contamination layer on the surface of a scintillator will reduce its efficiency.

Scintillators should be handled with the utmost care scince they are very fragile. The main problem in production is getting the material thin enough for optimum resolution. The coated surface should never be touched. They must be installed so that the active/coated side is facing toward the sample chamber and held securely in place with the scintillator retaining ring which must be in contact with the surface for optimum conductivity. Application of silver paint at this interface is no longer recommended.

Unless used in the backscatter mode, the scintillator has a 9–12 KV bias voltage applied. If arcing occurs in the area of the scintillator, damage could result. Furthermore, if scintillator material is removed in any way to produce pin holes, the underlying substrate may also charge up.

Scintillators are also discussed in my article "An Improved Light Pipe for the Scanning Electron Microscope", by M. E. Taylor, in "The Review Of Scientific Instruments", Vol. 43, No. 12, December 1972 (incorporated herein by reference).

U.S. Pat. No. 5,932,880 shows an SEM and a scintillator used therein in which electrodes are formed on the electron beam output plane and scintillation radiation plane and a high d.c. voltage is applied between the electrodes to control the scatter direction of an electron beam which has entered the scintillator to be in the direction of the scintillator radiation direction. In one embodiment, a transparent electrode of tin oxide, indium oxide, titanium oxide or the like is between the scintillator and a glass substrate, and the other electrode is deposited over the other side of the device and may be made of Al, Au, Ag, or Pt.

U.S. Pat. No. 5,517,033 shows an SEM using a scintillator comprised of an Al foil having a coating of scintillating material on the underside, and a mirror made of Al coated with a thin layer of Au to prevent oxidation. U.S. Pat. No. 5,536,941 shows a camera and prism assembly for electron microscopes having a scintillator of phosphor applied onto the surface of a glass prism mounted on a movable block. U.S. Pat. No. 5,491,339 shows a charged particle detection device used in addition to a scintillator for detecting a secondary electron signal from a sample using a semiconductor having on one side an oxide film covered with an Al film and a Au pad arranged around the detector in contact with the Al film, and on the inner surface of a hole therethrough an oxide film covered with a conductive film of Au, Pt, Ni, Ti or the like. All the above patents are incorporated herein by reference.

BRIEF SUMMARY OF THE INVENTION

It is a principle object of the invention to provide a scintillator for an electron microscope with improved qualities over previously known scintillators by having enhanced electrical contact, a reduction in pinhole interference, and a reduction of signal to noise ratio, and by eliminating the requirement for an aluminum coating.

It is a further object of the invention to provide an improved scintillator which is easier to handle than other known scintillators and that can be recoated.

It is also an object of the invention to provide a method of making a scintillator having the above advantages over known scintillators.

The above objects are achieved by the scintillator of this invention having a generally disc shape wherein a scintillator material of phosphor, organic, or single crystal is electrically conductively connected to an optical substrate of quartz glass, polymer, or any optically clear material, or light guide of an electron microscope, by a conductive, transparent indium tin oxide coating positioned between the interfaces of the scintillator material and the substrate. A retaining ring, preferably of gold, is bonded to and positioned around the rim or outer edge of the substrate and coating and has a radially inwardly extending lip overlying the outer edge portion of the surface of the coating which is connected to the scintillator material. An electrically conductive medium of adhesive, epoxy, or solder, for example, is positioned at the interface of the overlying surface of the lip and the outer edge portion of the coating so that optimum electrical conductivity is provided between the retaining ring, the medium and the substrate.

The above objects are further achieved by the method of this invention including the steps of fabricating the substrate from glass, plastic, or quartz, for example; coating an end of the substrate with indium tin oxide (ITO) by sputtering, thermal evaporation, or electron beam evaporation, for example; fabricating the retaining ring of gold, or platinum, or brass, copper, silver, platinum or other highly conductive material coated with a non-oxidizing material such as gold or platinum to eliminate oxidation, the ring having a radially inwardly extending lip on one end; applying electrical conducting medium of adhesive, Ag epoxy or solder on the underside of the lip, or on the radially outer edge portion of the ITO coating, or both; fitting the ring onto the substrate with the lip overlying the radially outer edge portion of the ITO and bonding the ring to the substrate and ITO coating; applying scintillation material to the outer surface of the ITO coating opposite to the substrate by settlement deposition according to Stokes Law, for example, then removing excess liquid leaving deposited phosphor material on the ITO coating and lip of the ring; and removing excess phosphor from the ITO coating and the lip by wiping or scraping, for example. Optionally, the step of applying a top reflective coating on the outer surface of the scintillating material by thermal evaporation or vapor deposition, for example, could be added to reflect unwanted light.

BRIEF DESCRIPTION OF THE DRAWINGS

The invention will now be described with reference to the accompanying drawings, wherein.

DETAILED DESCRIPTION

Figure 1:
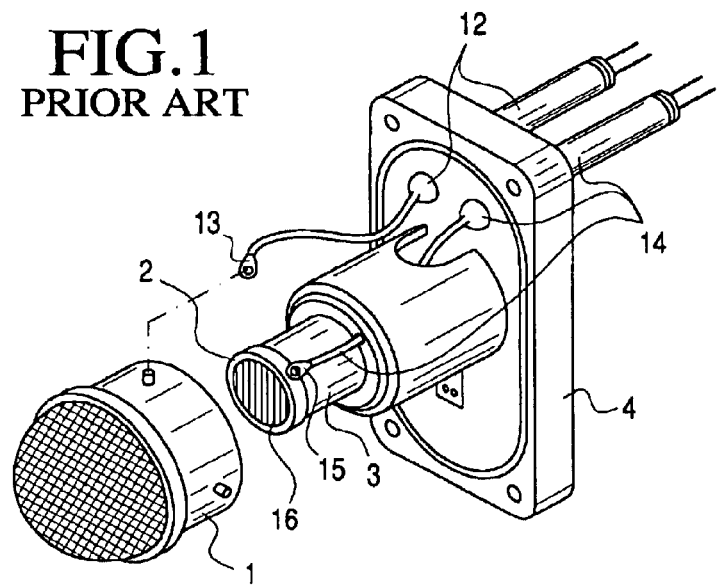
FIG. 1 is a schematic exploded view of detector part positioned inside the specimen chamber of a typical electron microscope.
Figure 2:
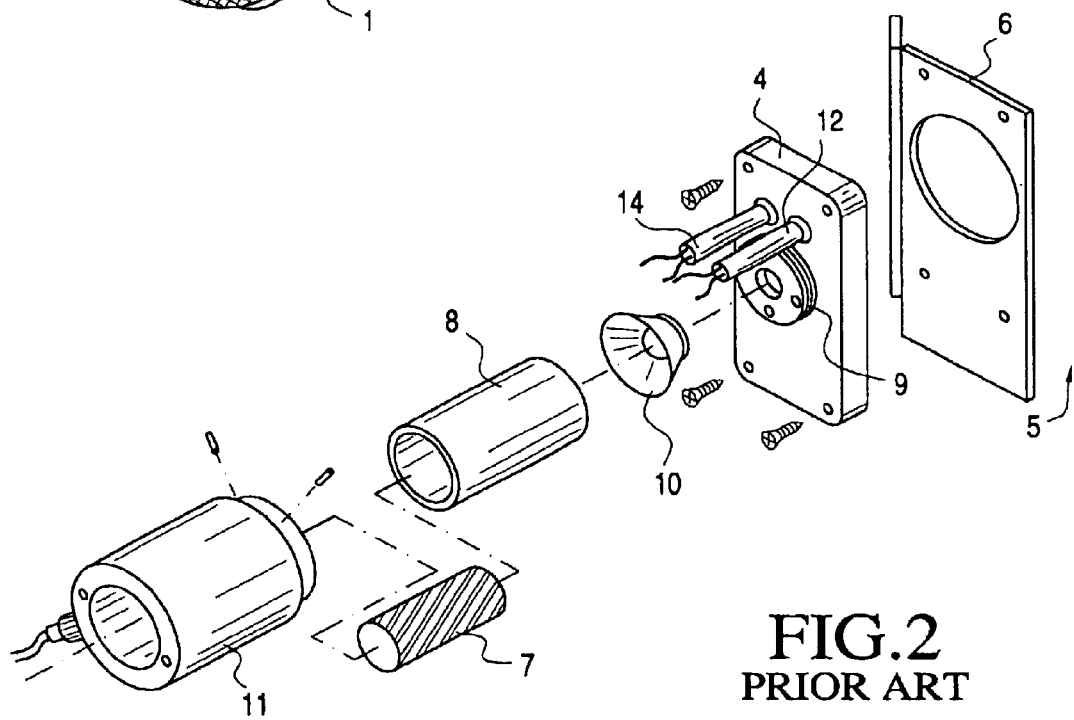
FIG. 2 is a view similar to FIG. 1 of the part of a typical electron microscope positioned outside the specimen chamber.
Figure 3:
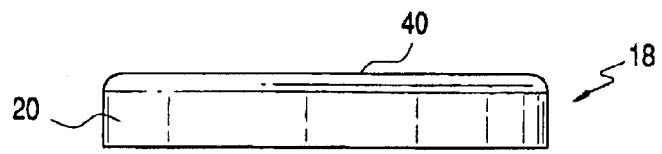
FIG. 3 is a side elevational view of the scintillator if this invention.
Figure 4:
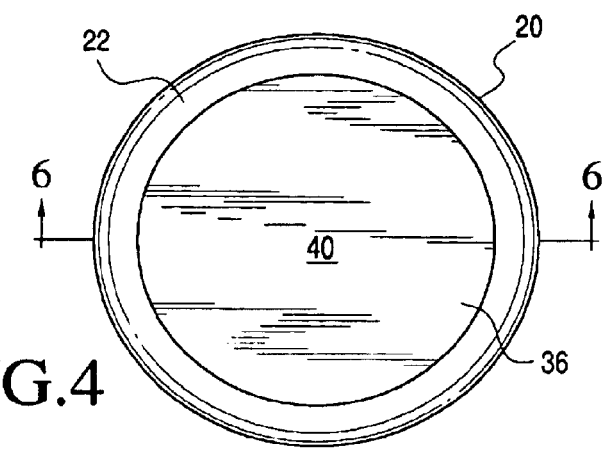
FIG. 4 is a top plan view of FIG. 3.
Figure 5:
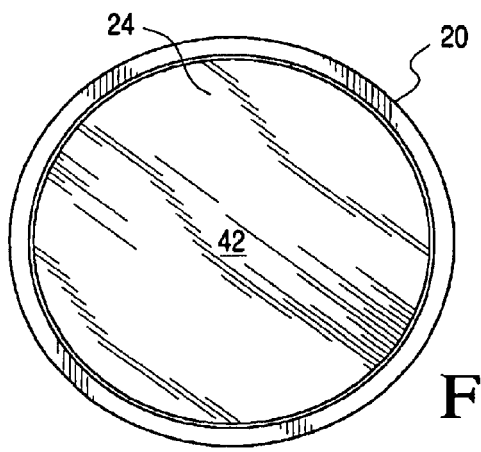
FIG. 5 is a bottom plan view of FIG. 3.

As described above, FIGS. 1 and 2 show schematically a typical prior art electron microscope of the type in which the invention can be used. The scintillator of this invention 18 is shown as a disc shaped member consisting of a non-oxidizing retaining ring 20 bonded on its internal surfaces 21 to an optical transparent substrate 24 of quartz, glass, polymer, or any optically clear material. An indium tin oxide (ITO) layer 26 of about 100 to 1000 angstrom thickness is bonded to the inner end 28 of the substrate. The ITO layer 26 is bonded to the inner surface of retaining ring 20 by an electrically conductive adhesive, epoxy, or solder 32, particularly in the area between the radially outer edge portion 34 and the inner side 30 of radially inwardly extending lip 22 on ring 20. A layer of scintillator material, preferably about 10 to 400 $\mu$m in thickness, 36 is bonded to the surface 38 of the ITO layer and lip 22 and adhesive material 32 so that electrons impinging on the outer surface 40 thereof produce photons which pass through the ITO layer 26 and are guided by the substrate 24 and the lightpipe, to which the substrate is connected at its outer surface 42 or is an integral part thereof, to the photomultiplier (PMT), such as shown in FIGS. 1 and 2.

In the method of producing the scintillator of this invention the substrate 24 is made from quartz, glass, plastic, or other suitable material by well known processes. The substrate thickness should be sufficient enough so that it does not easily deform. The ITO layer 26 is bonded to surface 28 of the substrate by sputtering, thermal evaporation, or electron beam evaporation, for example. Retaining ring 20 is made of gold, by cutting from a bar thereof, for example, and drilling, boring or otherwise forming to form a side wall 27, typically having a thickness of about 5 to 50 mils., and a lip 22 of similar thickness extending radially inwardly to overlie the outer edge portion 34 of ITO layer 26 and provide a close contacting relationship on and with substrate 24. If a gap 23 should result, this would be extremely small and relatively insignificant. The ring 20 can be made from other highly conductive material, such as brass, copper, silver, or aluminum, but these must be coated with gold to prevent oxidation on the surface. Electrically conductive adhesive, silver epoxy, solder or other highly conductive adhesive material is applied to the underside of lip 22, the outer edge surface 34 of layer 26, or both, and ring member 20 is then fitted over layer 26 and substrate 24 to firmly connect these parts together and bond all contiguous surfaces. Some of the adhesive material may flow into any gap 23 that may result as pointed out above.

Scintillator material, such as high quality P-47 phosphor type, (Y2-SiO2:Ce) is prepared by mixing the material in a liquid to produce a solution which is applied over surface 38 of the ITO layer and adjacent surface on ring lip 22, whereby the material forms a bonded layer by settlement deposition according to Stokes Law. Excess liquid is then removed leaving the deposited phosphor material. The phosphor material adheres to these surfaces by Van der Wal forces, or suitable binders can be included in the applied phosphor solution. Excess deposited phosphor is removed by wiping, scraping, or other suitable means to produce the finished surface 40. If desired, an optional coating of aluminum (not shown) could be applied by thermal evaporation, or vapor deposition, for example, to reflect unwanted light from the system.

Figure 6:
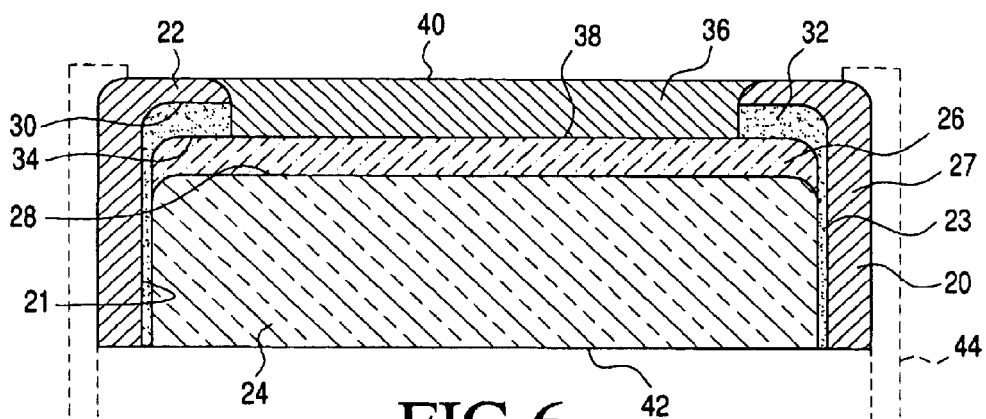
FIG. 6 is an enlarged cross-sectional view taken along the line 6 of FIG. 4.

The scintillator can be connected to or mounted on the light pipe 3 by a suitable means such as a connecting collar shown in dashed lines 44 in FIG. 6 having a friction fit, for example, or the lower end of the ring 20 can be extended (not shown) for attachment to the light pipe.

The novel features of this invention described above provide a scintillator for electron microscopes having better electrical contact than known scintillators resulting in lower signal to noise ratio. These scintillators are also easier to handle during installation, the conductive substrate reduces pinhole interference, and no aluminum coating is required. These scintillators can be made in any size as desired. Although the surfaces 28, 38, and 40 have been shown in the drawings as being substantially flat, they can have other configurations such as concave, convex, faceted, or angled, or any combination thereof. Additional advantages and modifications will readily occur to those skilled in the art. Therefore, the invention is not to be limited to the specific details and representative devices shown and described, since various modifications may be made without departing from the spirit or scope of the invention as defined only by the claims appended hereto.

I claim:

1. A scintillator for an electron microscope comprising:

a disc shaped substrate of optically clear material having a first surface and a second surface facing oppositely to said first surface, and a side wall portion forming an edge of said disc;

an indium tin oxide coating on said first surface having an outer surface on a side thereof opposite to that engaging said substrate;

an outer edge portion on said outer surface of said coating;

an electrically conductive retaining ring having opposite ends and a non-oxidizing exterior around said wall of said substrate;

a radially inwardly extending lip on one end of said ring overlying in spaced relation said outer edge portion of said outer surface on said indium tin oxide coating and forming a central opening in said one end of said ring;

an electrically conductive adhesive means between and connecting said overlying lip and said outer edge portion of said indium tin oxide coating;

a scintillator material having an inner surface electrically conductively connected to said outer surface on said indium tin oxide coating and extending through said central opening in said one end of said ring; and an outer surface on said scintillator material opposite to said inner surface thereof connected to said indium tin oxide coating.

2. The scintillator claimed in claim 1, wherein:

said retaining ring comprises solid gold;

said substrate comprises quartz; and said scintillator material comprises phosphor.

3. The scintillator claimed in claim 2 wherein:

said indium tin oxide coating has a thickness of 100 to 1000 angstom; and said adhesive means comprises silver solder.

4. The method of making a scintillator for an electron microscope comprising:

providing a disc shaped substrate of optically clear material having a first surface, a second oppositely facing surface, and an outer edge side wall;

applying a coating of indium tin oxide on said first surface of said substrate by sputtering;

providing an electrical conducting retaining ring having a non-oxidizing surface, an internal size to fit in close contacting engagement with said side wall of said substrate, and a radially inwardly extending lip on one end;

applying electrical conducting adhesive means on at least the radially outer edge portion of the exposed surface of said indium tin oxide coating;

fitting said retaining ring onto said substrate in close contacting engagement with said side wall of said substrate and said lip overlying in close contacting engagement with said radially outer edge portion of said indium tin oxide coating having said adhesive means thereon to bond said ring to said coating and said substrate; and depositing scintillation material onto and in bonding relationship with said exposed surface of said coating.

5. The scintillator as claimed in claim 1 wherein:

said retaining ring comprises copper having an exterior coating of gold;

said substrate comprises quartz; and said scintillator material comprises phosphor.

6. The scintillator as claimed in claim 2 wherein:

said retaining ring has a side wall having a thickness of substantially 5 to 50 mils.

7. The scintillator as claimed in claim 1 wherein:

said scintillator material is planar in shape and has a thickness of approximately 10 to 400 $\mu$m.

8. The scintillator as claimed in claim 6 wherein:

said scintillator material has a thickness of approximately 10 to 400 $\mu$m.

* * * * *